United States Patent
Cheng (10) Patent No.: US 10,440,839 B2
(45) Date of Patent: Oct. 8, 2019

(54) DISPLAY SCREEN ASSEMBLY, ASSEMBLING METHOD THEREOF AND ELECTRONIC DEVICE

(71) Applicant: GUANGDONG OPPO MOBILE TELECOMMUNICATIONS CORP., LTD., Dongguan (CN)

(72) Inventor: Jiao Cheng, Dongguan (CN)

(73) Assignee: GUANGDONG OPPO MOBILE TELECOMMUNICATIONS CORP., LTD., Dongguan, Guangdong (CN)

( * ) Notice: Subject to any disclaimer, the term of this patent is extended or adjusted under 35 U.S.C. 154(b) by 78 days.

(21) Appl. No.: 15/686,192

(22) Filed: Aug. 25, 2017

(65) Prior Publication Data

US 2018/0199446 A1  Jul. 12, 2018

(30) Foreign Application Priority Data

Jan. 9, 2017 (CN) .......................... 2017 1 0013745
Jan. 9, 2017 (CN) ...................... 2017 2 0022966 U (51) Int. Cl.
| | |
|---|---|
| H05K 5/00 | (2006.01) |
| G06F 1/16 | (2006.01) |
| G02F 1/1333 | (2006.01) |
| G06F 3/041 | (2006.01) |
| H01L 27/32 | (2006.01) |
| H05K 5/03 | (2006.01) |

(52) U.S. Cl.
CPC ..... *H05K 5/0017* (2013.01); *G02F 1/133308* (2013.01); *G06F 1/1637* (2013.01);
(Continued)

(58) Field of Classification Search
CPC ... G02F 1/133308; G02F 2001/133325; G02F 2001/133331; G06F 1/1637; G06F 1/1656;
(Continued)

(56) References Cited

U.S. PATENT DOCUMENTS

2012/0073115 A1  3/2012 Filson et al.
2013/0329460 A1*  12/2013 Mathew .................. H05K 5/02
                                                    362/612
(Continued)

FOREIGN PATENT DOCUMENTS

CN  102880350 A  1/2013
CN  202750130 U  2/2013
(Continued)

OTHER PUBLICATIONS

ISA/CN, International Search Report and Written Opinion for PCT/CN2017/098974, dated Nov. 17, 2017.
(Continued)

*Primary Examiner* — Viet D Pham
(74) *Attorney, Agent, or Firm* — Hodgson Russ LLP (57) ABSTRACT

The present disclosure relates to a display screen assembly, an electronic device and an assembling method of the display screen assembly. The display screen assembly includes a cover plate, a display screen, a bracket and a decoration enclosure. A top surface of the display screen is joined with a lower surface of the cover plate, a width of the display screen is larger than that of the cover plate, and a side edge of the cover plate is indented inwards relative to the display screen. The bracket includes a top portion joined with a bottom surface of the display screen and a side wall. The decoration enclosure includes a first joining part joined with the side wall and a second joining part. The second joining part is joined with the side edge of the cover plate and configured to cover a non-display area of the display screen.

20 Claims, 6 Drawing Sheets

(52) U.S. Cl.
CPC ........ *G06F 1/1656* (2013.01); *G06F 3/0412*
(2013.01); *H01L 27/323* (2013.01); *H05K*
*5/0086* (2013.01); *H05K 5/03* (2013.01);
*G02F 2001/133325* (2013.01); *G02F*
*2001/133331* (2013.01)

(58) Field of Classification Search
CPC ... G06F 3/0412; H01L 27/323; H05K 5/0017;
H05K 5/0086; H05K 5/03
See application file for complete search history.

(56) References Cited

U.S. PATENT DOCUMENTS

2014/0240926 A1* 8/2014 Choi ............... H04M 1/0266
361/707
2016/0150656 A1   5/2016 Maki et al.

FOREIGN PATENT DOCUMENTS

| CN | 104167154 | | 11/2014 | |
| CN | 104866018 | | 8/2015 | |
| CN | 104866020 | A * | 8/2015 | ........... G06F 1/1637 |
| CN | 104866021 | A | 8/2015 | |
| CN | 104933970 | A | 9/2015 | |
| CN | 105376359 | | 3/2016 | |
| CN | 105916317 | A | 8/2016 | |
| CN | 106101324 | | 11/2016 | |
| WO | 2016061019 | | 4/2016 | |

OTHER PUBLICATIONS

EPO, Office Action for EP Application No. 17187510, dated Mar. 7, 2018.

SIPO, First Office Action for CN Application No. 201710013745, dated Dec. 27, 2018.

* cited by examiner

DISPLAY SCREEN ASSEMBLY, ASSEMBLING METHOD THEREOF AND ELECTRONIC DEVICE

CROSS-REFERENCE TO RELATED APPLICATIONS

This application claims priority to and benefits of Chinese Patent Application Nos. 201710013745.5 and 201720022966.4, filed with State Intellectual Property Office on Jan. 9, 2017, the entire content of which is incorporated herein by reference.

FIELD

The present disclosure relates to a technical field of electronic devices, particularly to a display screen assembly, an electronic device and an assembling method of the display screen assembly.

BACKGROUND

With developments of technologies, smartphones are used more and more widely and have more and more functions, and smartphones have become requisite electronic apparatuses in people's daily lives. The existing smartphones have a low screen-to-body ratio, so that the user experience of a user is not good.

SUMMARY

According to a first aspect of embodiments of the present disclosure, there is provided a display screen assembly. The display screen assembly includes a cover plate, a display screen, a bracket and a decoration enclosure. A top surface of the display screen is joined with a lower surface of the cover plate, a width of the display screen is larger than a width of the cover plate, and a side edge of the cover plate is indented inwards relative to the display screen. The bracket includes a top portion and a side wall, and a bottom surface of the display screen is joined with the top portion of the bracket. The decoration enclosure includes a first joining part and a second joining part bending from the first joining part. The first joining part is joined with the side wall of the bracket, and the second joining part is joined with the side edge of the cover plate and configured to cover a non-display area of the display screen.

According to a second aspect of embodiments of the present disclosure, there is provided an electronic device. The electronic device includes a display screen assembly and a rear cover coupled to the display screen assembly to define an accommodating space therebetween. The display screen assembly includes a cover plate, a display screen, a bracket and a decoration enclosure. A top surface of the display screen is joined with a lower surface of the cover plate, the display screen has a width larger than the cover plate, and a side edge of the cover plate is indented inwards relative to the display screen. The bracket includes a top portion joined with a bottom surface of the display screen, and a side wall. The decoration enclosure includes a first joining part joined with the side wall of the bracket, and a second joining part bending from the first joining part, joined with the side edge of the cover plate and configured to cover a non-display area of the display screen.

According to a third aspect of embodiments of the present disclosure, there is provided an assembling method. The assembling method includes:

providing a bracket, in which the bracket includes a top portion and a side wall;

providing a decoration enclosure, in which the decoration enclosure includes a first joining part and a second joining part bending from the first joining part;

joining the first joining part with the side wall of the bracket by dispensing adhesive therebetween;

providing a display screen and a cover plate;

mounting the display screen and the cover plate on the top portion of the bracket; and joining a side edge of the cover plate with the second joining part by dispensing adhesive therebetween and shielding a non-display area of the display screen by the second joining part.

Additional aspects and advantages of embodiments of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of embodiments of the present disclosure will become apparent and readily appreciated from descriptions made with reference to following drawings.

DETAILED DESCRIPTION

Embodiments of the present disclosure will be described in detail and examples of the embodiments will be illustrated in the drawings, where same or similar reference numerals are used to indicate same or similar members or members with same or similar functions. The embodiments described herein with reference to drawings are explanatory, illustrative, and used to generally understand the present disclosure. The embodiments shall not be construed to limit the present disclosure.

In the specification, it is to be understood that terms such as "central", "longitudinal", "lateral", "length", "width", "thickness", "upper", "lower", "front", "rear", "left", "right", "vertical", "horizontal", "top", "bottom", "inner", "outer", "clockwise" and "counterclockwise", should be construed to refer to the orientation as then described or as shown in the drawings under discussion. These relative terms are for convenience of description and do not require that the present disclosure be constructed or operated in a particular orientation. In addition, terms such as "first" and "second" are used herein for purposes of description and are not intended to indicate or imply relative importance or significance. Thus, features limited by "first" and "second" are intended to indicate or imply including one or more than one these features. In the description of the present disclosure, "a plurality of" means two or more than two, unless specified otherwise.

In the present disclosure, unless specified or limited otherwise, the terms "mounted", "connected", "coupled", "fixed" and the like are used broadly, and can be, for example, fixed connections, detachable connections, or integral connections; can also be mechanical or electrical connections; can also be direct connections or indirect connections via intervening structures; can also be inner communications of two elements. The above terms can be understood by those skilled in the art according to specific situations.

In the description of the present disclosure, a structure in which a first feature is "on" a second feature can include an embodiment in which the first feature directly contacts the second feature, and can also include an embodiment in which an additional feature is formed between the first feature and the second feature so that the first feature does not directly contact the second feature, unless otherwise specified. Furthermore, a first feature "on", "above", or "on top of" a second feature can include an embodiment in which the first feature is right "on", "above" or "on top of" the second feature, and can also include an embodiment in which the first feature is not right "on", "above" or "on top of" the second feature, or just means that the first feature has a sea level elevation larger than the sea level elevation of the second feature. While first feature "beneath", "below" or "on bottom of" a second feature can include an embodiment in which the first feature is right "beneath", "below" or "on bottom of" the second feature, and can also include an embodiment in which the first feature is not right "beneath", "below" or "on bottom of" the second feature, or just means that the first feature has a sea level elevation smaller than the sea level elevation of the second feature.

The following disclosure provides many different embodiments or examples to realize different structures of the present disclosure. To simplify the disclosure of the present disclosure, components and configurations in particular examples are elaborated. Of course, they are illustrative, and are not intended to limit the present disclosure. Moreover, reference numbers and/or letters can be repeated in different examples of the present disclosure for the purpose of simplicity and clarity, which shall not be constructed to indicate the relationships among various embodiments and/or configurations. In addition, the present disclosure provides examples of various specific processes and materials, but applicability of other processes and/or utilization of other materials are conceivable for those skilled in the art.

Figure 1:
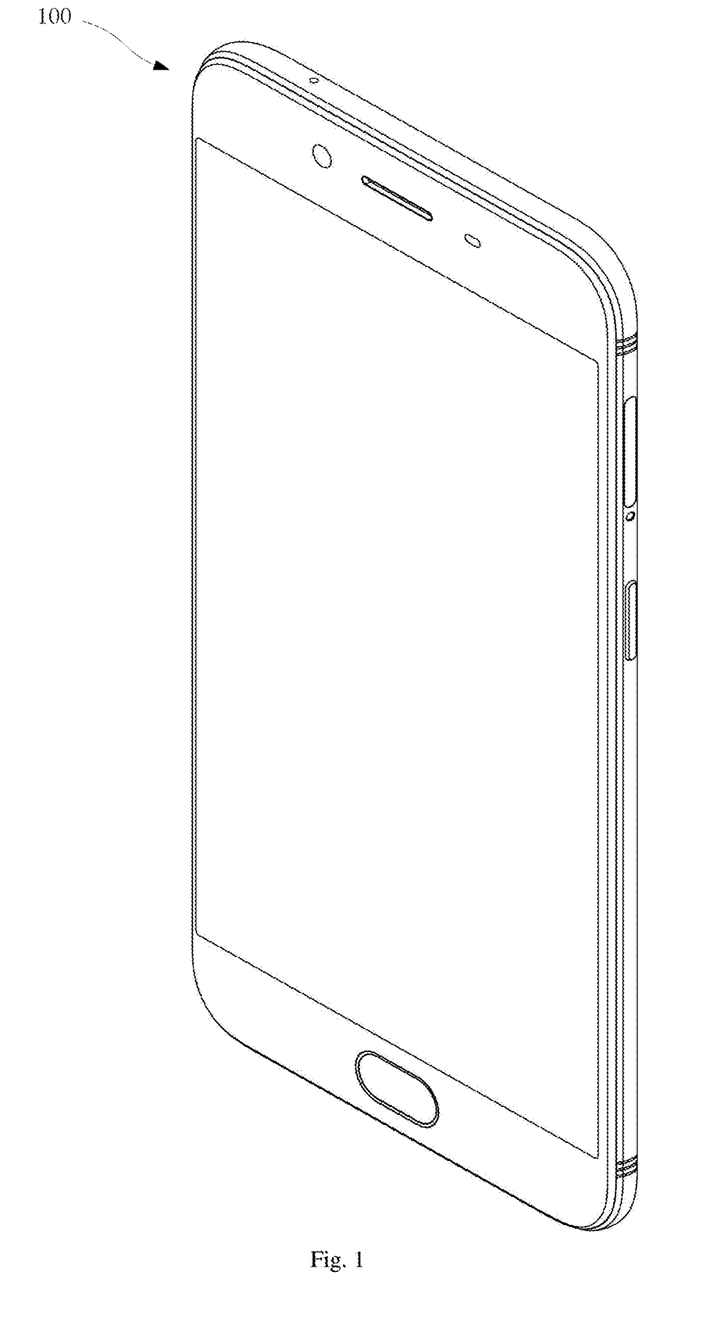
FIG. 1 illustrates a perspective view of an electronic device according to an embodiment of the present disclosure.
Figure 2:
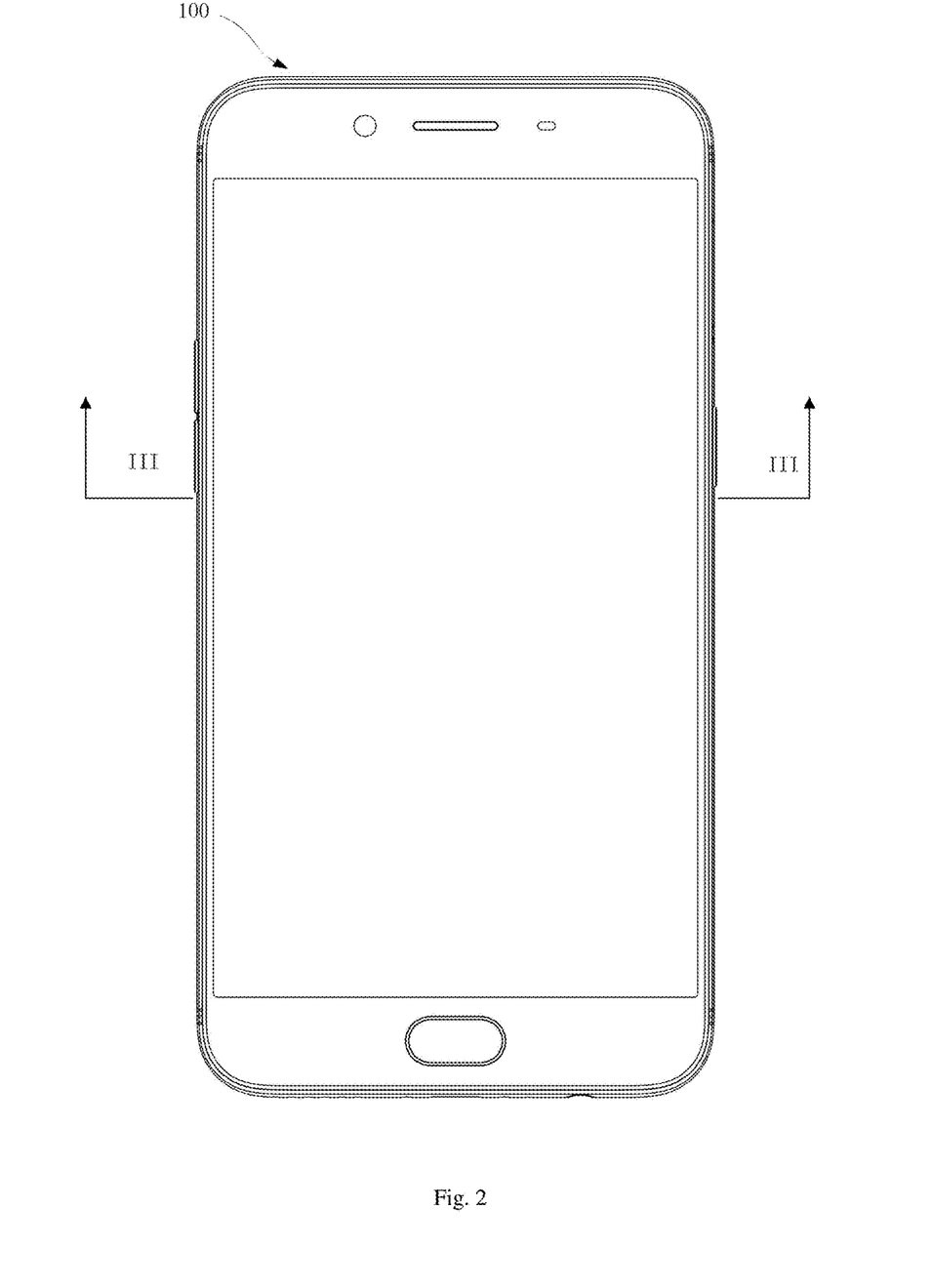
FIG. 2 illustrates a plan view of an electronic device according to an embodiment of the present disclosure.
Figure 3:
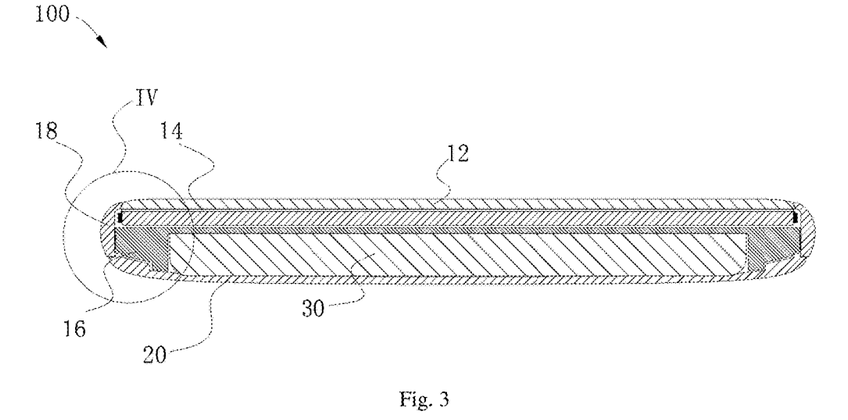
FIG. 3 illustrates a sectional view of the electronic device in FIG. 2 taken along line III-III.

As illustrated in FIGS. 1 to 3, an electronic device 100 according to embodiments of the present disclosure includes a display screen assembly 10, a rear cover 20 and a battery 30. The electronic device 100 includes but is not limited to a mobile phone, a tablet computer, a smart watch and the like.

In some embodiments, the display screen assembly 10 is configured to display images, texts and so on. Moreover, the display screen assembly 10 can also be configured to receive a touch operation of a user. As illustrated in FIG. 3, the display screen assembly 10 includes a cover plate 12, a display screen 14, a bracket 16 and a decoration enclosure 18.

Figure 4:
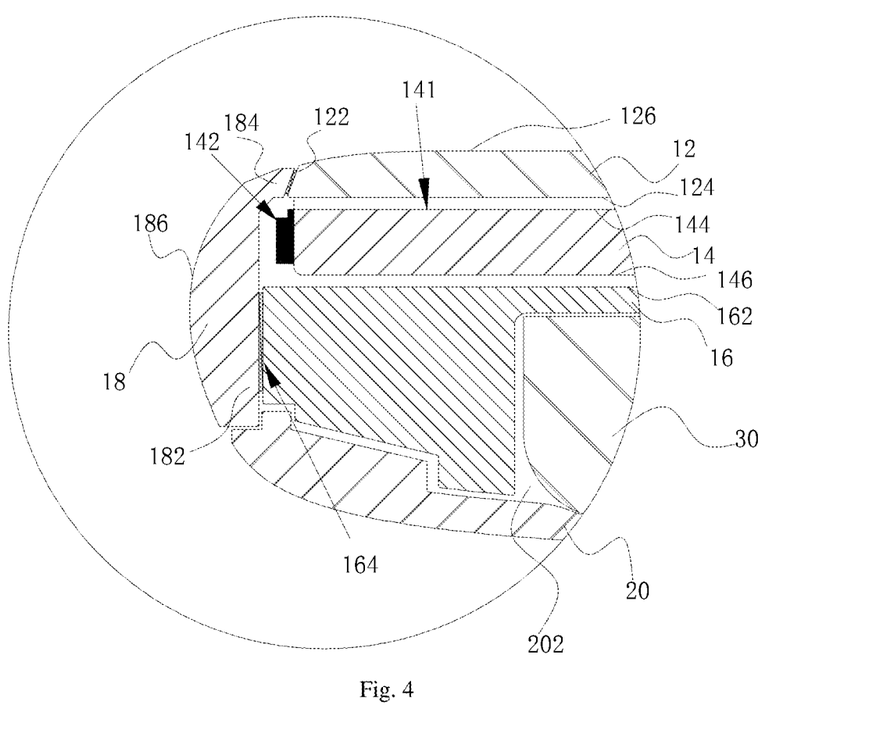
FIG. 4 illustrates an enlarged view of portion IV in FIG. 3.

As illustrated in FIG. 4, in an embodiment of the present disclosure, the cover plate 12 is configured as a touch-screen cover plate. In other words, a touch control circuit of a touch screen is integrated in the cover plate 12, and a touch control function can be achieved by clicking the cover plate 12. The cover plate 12 can be made of materials such as glass, sapphire, or polyvinyl chloride (PVC), etc. In some embodiments, the cover plate 12 is configured to have two layers of structures, namely a touch panel and a protection cover sheet disposed on the touch panel. The touch panel includes the touch control circuit of the touch screen and is configured to achieve a touch operation of the display screen assembly 10, and the protection cover sheet is configured to protect the touch panel from being damaged due to direct touch operations on the touch panel. In other words, the cover plate 12 serves as the touch screen with better protection thereof. A side edge 122 of the cover plate 12 is configured as an inclined surface. In other words, the cover plate 12 has a trapezoidal cross section. An area of an upper surface 126 of the cover plate 12 is less than an area of a lower surface 124 of the cover plate 12.

A top surface 144 of the display screen 14 is joined with the lower surface 124 of the cover plate 12. The lower surface 124 of the cover plate 12 and the top surface 144 of the display screen 14 can be laminated in a full lamination manner. In some embodiments of the present disclosure, the lower surface 124 of the cover plate 12 and the top surface 144 of the display screen 14 can be laminated by means of an optically clear adhesive (OCA). A width of the display screen 14 is larger than a width of the cover plate 12, and the side edge 122 of the cover plate 12 is indented inwards relative to the display screen 14. In other words, the cover plate 12 cannot cover the display screen 14 completely, and is configured to have a stepped shape gradually expanding in a direction from the cover plate 12 to the display screen 14. The display screen 14 and the cover plate 12 are laminated in a full lamination manner. The display screen 14 can be configured as a liquid crystal display (LCD), an organic light-emitting diode (OLED) display screen or a flexible OLED display screen. The display screen 14 includes a display area 141 and a non-display area 142, the display area 141 is configured to achieve a function of the display screen assembly 10 for displaying images, texts and the like, and the non-display area 142 is configured for wiring.

The bracket 16 includes a top portion 162 and a side wall 164, and a bottom surface 146 of the display screen 14 is joined with the top portion 162 of the bracket 16. In some embodiments of the present disclosure, the bottom surface 146 of the display screen 14 is joined with the top portion 162 of the bracket 16 in an adhering manner. In some embodiments of the present disclosure, the adhering manner can be achieved by dispensing an adhesive or using a double sided adhesive, or by a combination thereof.

The decoration enclosure 18 includes a first joining part 182 and a second joining part 184 bending from the first joining part 182, and the first joining part 182 is joined with the side wall 164. In some embodiments of the present disclosure, the first joining part 182 is joined with the side wall 164 in an adhering manner. In some embodiments of the present disclosure, the adhering manner can be achieved by dispensing the adhesive. The second joining part 184 is joined with the side edge 122 of the cover plate 12 by means of dispensing adhesive therebetween, and shields the non-display area 142 of the display screen 14. In other words, the second joining part 184 protrudes towards the side edge 122 of the cover plate, so that a width difference between the cover plate 12 and the display screen 14 can compensated to enclose the display screen 14 in the display screen assembly 10. A surface of the second joining part 184 joined to the side edge 122 of the cover plate 12 is configured as an inclined surface, and has an inclined angle approximate to or consistent with an inclined angle of the side edge 122 of the cover plate 12. An outer surface 186 of the decoration enclosure 18 is configured to have an arc shape. In some embodiments of the present disclosure, the decoration enclosure 18 can surround the side edge 122 of the cover plate 12.

The rear cover 20 is joined with the display screen assembly 10 to define an accommodating space 202, and the battery 30 is received in the accommodating space 202. The accommodating space 202 has a size and a shape which are matched with a size and a shape of the battery 30. Specifically, the rear cover 20 can be coupled to the bracket 16 or the decoration enclosure 18 by means of adhering, snapping or screwing. A coupling manner is not limited to the above kinds. The rear cover 20 can be joined with the display screen assembly 10 by selecting an appropriate manner in a practical application. The rear cover 20 can be made of metal materials, such as steel, aluminum alloy or magnesium alloy. The rear cover 20 can also be made of nonmetal materials, such as acrylonitrile-butadiene-styrene copolymer (ABS), polyvinyl chloride (PVC) or polycarbonate (PC). The material of the rear cover 20 is not limited to the materials mentioned above, and an appropriate material can be selected according to requirements in a practical application.

During assembling the display screen assembly 10 according to embodiments of the present disclosure, the cover plate 12 is fully laminated with the display screen 14 first, and then the bottom surface 146 of the display screen 14 is joined with the top portion 162 of the bracket 16 by dispensing adhesive therebetween after the cover plate 12 and the display screen 4 are laminated fully, so that the cover plate 12, the display screen 14 and the bracket 16 are joined as a whole. Further, the decoration enclosure 18 is fitted onto the bracket 16, the first joining part 182 is joined with the side wall 164 by dispensing adhesive therebetween, and the second joining part 184 is joined with the side edge 122 of the cover plate 12 by dispensing adhesive therebetween. Thus, the display screen assembly 10 is formed. The bottom surface 146 of the display screen 14 can also be joined with the top portion 162 of the bracket 16 first, and then the cover plate 12 is fully laminated with the display screen 14.

In the display screen assembly 10 according to embodiments of the present disclosure, the second joining part 184 protrudes towards the side edge 122 of the cover plate 12, and is joined with the side edge 122 of the cover plate 12 to shield the non-display area 142 of the display screen 14. However, the cover plate in the related art is screen-printed with a circle of black-ink edge at its periphery to shield the non-display area 142 of the display screen 14 and other internal structures. In the display screen assembly 10 according to embodiments of the present disclosure, since structures of the decoration enclosure 18, the cover plate 12 and the display screen 14 are reasonably designed, the second joining part 184 is joined with the side edge 122 of the cover plate 12 to shield the non-display area 142 of the display screen 14 and other internal structures, thus replacing the black-ink edge in the related art, which avoids the circle of black-ink edge screen-printed at the periphery of the cover plate 12, and hence improves a screen-to-body ratio.

The display screen assembly 10 according to embodiments of the present disclosure eliminates the black-ink edge of the cover plate 12. When the display screen assembly 10 according to embodiments of the present disclosure is applied to an electronic device 100, the user will not see the black-ink edge on the screen. Thus, the screen-to-body ratio is increased, the product quality is enhanced and the user experience is improved.

Further, the second joining part 184 is joined with the side edge 122 of the cover plate 12 by dispensing adhesive therebetween. This joining manner allows the second joining part 184 to be fixedly coupled to the side edge 122 of the cover plate 12, and also provides a good sealing performance to achieve a waterproof function. Thus, a waterproof performance of the electronic device 100 is enhanced, and the user experience is further improved.

Furthermore, when the electronic device 100 is configured as the mobile phone, the tablet computer or other handheld electronic devices, the outer surface 186 of the decoration enclosure 18 which has the arc shape can improve a hand feel of holding the electronic device 100 by hands. Thus, the user can hold the electronic device 100 by hands comfortably.

In addition, the second joining part 184 protrudes towards the side edge 122 of the cover plate 12, and the second joining part 184 is joined with the side edge 122 of the cover plate 12 to shield the non-display area 142 of the display screen 14. The second joining part 184 serves as an inwards-fastening structure to hold the display screen 14 in the electronic device 100, so that the structure of the electronic device 100 is more stable. Moreover, since the black-ink edge is not needed to be screen-printed at the periphery of the cover plate 12, manufacturing processes of the electronic device 100 and the display screen assembly 10 can be simplified.

Further, since the first joining part 182 of the decoration enclosure 18 is joined with the side wall 164 of the bracket 16 by dispensing adhesive therebetween, and the second joining part 184 is joined with the side edge 122 of the cover plate 12 by dispensing adhesive therebetween, when the electronic device 100 is thrown up, falls down or collides with other objects at a high speed, a force exerted on the display screen 14 can be alleviated to prevent a separation phenomenon of layers of the display screen 14.

Figure 5:
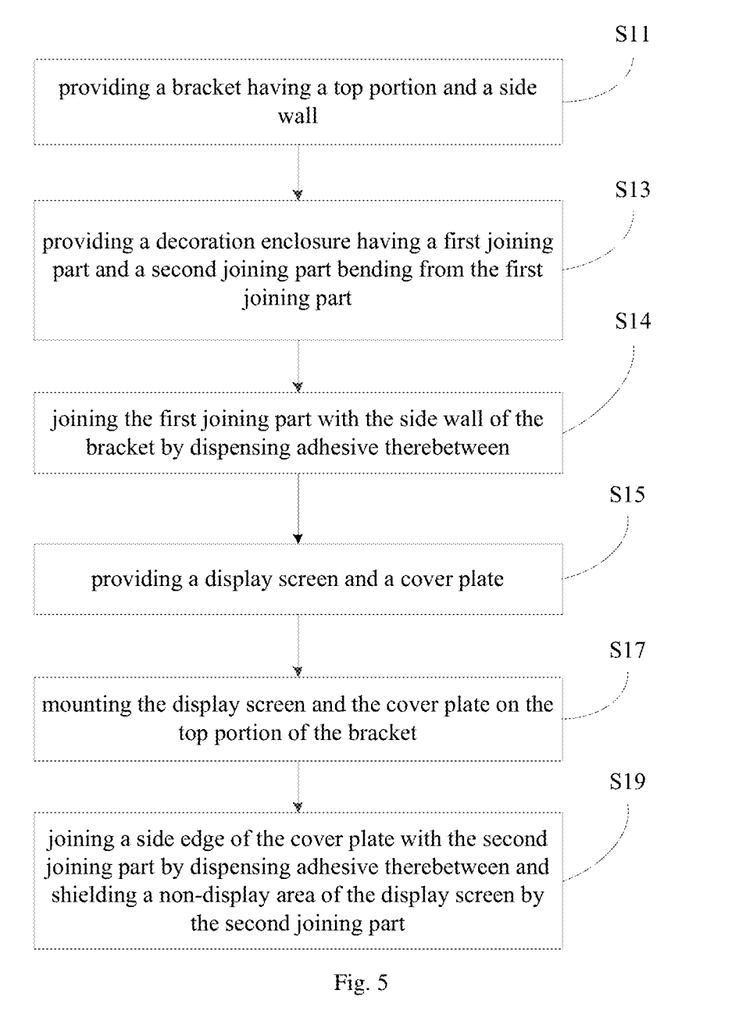
FIG. 5 illustrates a flow chart of an assembling method of a display screen assembly according to an embodiment of the present disclosure.

As illustrated in FIGS. 4 and 5, an assembling method according to embodiments of the present disclosure includes actions at following blocks.

At block S11: a bracket 16 is provided, in which the bracket 16 includes a top portion 162 and a side wall 164.

At block S13: a decoration enclosure 18 is provided, in which the decoration enclosure 18 includes a first joining part 182 and a second joining part 184 bending from the first joining part 182.

At block S14: the first joining part 182 is joined with the side wall 164 by dispensing adhesive therebetween.

At block S15: a display screen 14 and a cover plate 12 are provided.

At block S17: the display screen 14 and the cover plate 12 are arranged on the top portion 162.

At block S19: the second joining part 184 is joined with a side edge 122 of the cover plate 12 by dispensing adhesive therebetween and the second joining part 184 shields a non-display area 142 of the display screen 14.

The cover plate 12 is configured as a touch-screen cover plate. In other words, a touch control circuit of a touch screen is integrated in the cover plate 12, and a touch control function can be achieved by clicking the cover plate 12. The cover plate 12 can be made of materials such as glass, sapphire, or polyvinyl chloride (PVC), etc. In some embodiments, the cover plate 12 is configured to have two layers of structures, namely a touch panel and a protection cover sheet disposed on the touch panel. The touch panel includes the touch control circuit of the touch screen and is configured to achieve a touch operation of the display screen assembly 10, and the protection cover sheet is configured to protect the touch panel from being damaged due to direct touch operations on the touch panel. In other words, the cover plat 12 serves as the touch screen with between protection thereof. The side edge 122 of the cover plate 12 is configured as an inclined surface. In other words, the cover plate 12 has a trapezoidal cross section. An area of an upper surface 126 of the cover plate 12 is less than an area of a lower surface 124 of the cover plate 12.

The second joining part 184 of the decoration enclosure 18 protrudes towards the side edge 122 of the cover plate, so that a width difference between the cover plate 12 and the display screen 14 is compensated to enclose the display screen 14 in the display screen assembly 10. A surface of the second joining part 184 joined to the side edge 122 of the cover plate 12 is configured as an inclined surface, and has an inclined angle approximate to or consistent with an inclined angle of the side edge 122 of the cover plate 12. An outer surface 186 of the decoration enclosure 18 is configured to have an arc shape. In some embodiments of the present disclosure, the decoration enclosure 18 can surround the side edge 122 of the cover plate 12.

Figure 6:
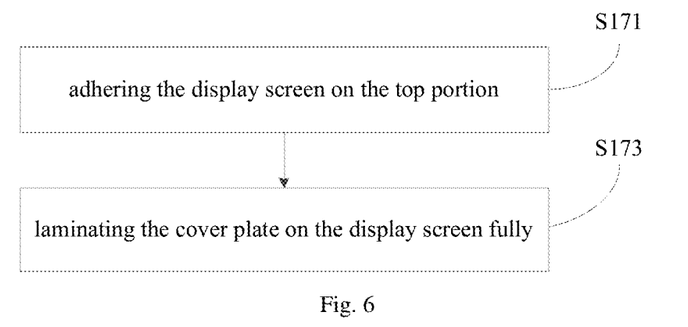
FIG. 6 illustrates a flow chart of an assembling method of a display screen assembly according to an embodiment of the present disclosure.

In combination with FIG. 6, in some embodiments, the action at step S17 includes actions at following blocks.

At block S171: the display screen 14 is adhered on the top portion 162.

At block S173: the cover plate 12 is fully laminated on the display screen 14.

The lower surface 124 of the cover plate 12 and the top surface 144 of the display screen can be laminated by means of an optically clear adhesive (OCA). A width of the display screen 14 is larger than a width of the cover plate 12, and the side edge 122 of the cover plate 12 is indented inwards relative to the display screen 14. In other words, the cover plate 12 cannot cover the display screen 14 completely, and is configured to have a stepped shape gradually expanding in a direction from the cover plate 12 to the display screen 14. The display screen 14 and the cover plate 12 are laminated in a full lamination manner. The display screen 14 can be configured as a liquid crystal display (LCD), an organic light-emitting diode (OLED) display screen or a flexible OLED display screen. The display screen 14 includes a display area 141 and the non-display area 142, the display area 141 is configured to achieve a function of the display screen assembly 10 for displaying images, texts and the like, and the non-display area 142 is configured for wiring.

The display screen assembly 10 assembled by the assembling method according to embodiments of the present disclosure eliminates the black-ink edge of the cover plate 12, so that when the display screen assembly 10 is applied to an electronic device 100, the user will not see the black-ink edge on the screen. Thus, a screen-to-body ratio is increased, a product quality is enhanced and the user experience is improved.

Further, the second joining part 184 is joined with the side edge 122 of the cover plate 12 by dispensing adhesive therebetween. This joining manner allows the second joining part 184 to be fixedly coupled to the side edge 122 of the cover plate 12, and also provides a good sealing performance to achieve a waterproof function. Thus, a water proof performance of the electronic device 100 is enhanced, and the user experience is further improved.

Furthermore, when the electronic device 100 is configured as the mobile phone, the tablet computer or other handheld electronic devices, the outer surface 186 of the decoration enclosure 18 which has the arc shape can improve a hand feel of holding the electronic device 100 by hands. Thus, the user can hold the electronic device 100 by hands comfortably.

In addition, the second joining part 184 protrudes towards the side edge 122 of the cover plate 12, and the second joining part 184 is joined with the side edge 122 of the cover plate 12 to shield the non-display area 142 of the display screen 14. The second joining part 184 serves as an inwards-fastening structure to hold the display screen 14 in the electronic device 100, so that the structure of the electronic device 100 is more stable. Moreover, since the black-ink edge is not needed to be screen-printed at the periphery of the cover plate 12, manufacturing processes of the electronic device 100 and the display screen assembly 10 can be simplified.

Further, since the first joining part 182 of the decoration enclosure 18 is joined with the side wall 164 of the bracket 16 by dispensing adhesive therebetween, and the second joining part 184 is joined with the side edge 122 of the cover plate 12 by dispensing adhesive therebetween, when the electronic device 100 is thrown up, falls down or collides with other objects at a high speed, a force exerted on the electronic device 100 can be alleviated to prevent a separation phenomenon of layers of the display screen 14.

Figure 7:
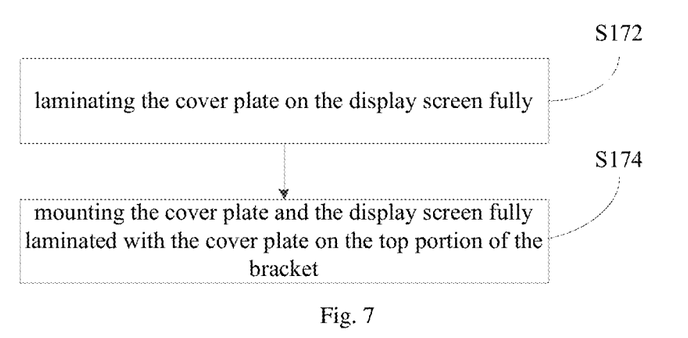
FIG. 7 illustrates a flow chart of an assembling method of a display screen assembly according to an embodiment of the present disclosure.

In combination with FIG. 7, in some embodiments, the action at step S17 includes actions at following blocks.

At block S172: the cover plate 12 is fully laminated on the display screen 14.

At block S174: the cover plate 12 and the display screen 14 fully laminated with the cover plate 12 are mounted on the top portion 162.

In other words, the display screen 14 can be adhered to the top portion 162 first, and then the cover plate 12 is fully laminated on the display screen 14. In some embodiments of the present disclosure, the cover plate 12 can be fully laminated on the display screen 14 first, and then the bottom surface 146 of the display screen 14 is adhered to the top portion 162.

Reference throughout this specification to "an embodiment", "some embodiments", "an illustrative embodiment", "an example", "a specific example" or "some examples", means that a particular feature, structure, material, or characteristic described in connection with the embodiment or example is included in at least one embodiment or example of the present disclosure. Thus, the appearances of the phrases in various places throughout this specification are not necessarily referring to the same embodiment or example of the present disclosure. Furthermore, the particular features, structures, materials, or characteristics can be combined in any suitable manner in one or more embodiments or examples.

In addition, terms such as "first" and "second" are used herein for purposes of description and are not intended to indicate or imply relative importance or significance. Thus, the feature defined with "first" and "second" can comprise one or more of this feature. In the description of the present disclosure, "a plurality of" means two or more than two, unless specified otherwise.

Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure. The scope of the present disclosure is limited by the claims and its equivalence.

What is claimed is:

1. A display screen assembly, comprising:
   a cover plate;
   a display screen having a top surface joined with a lower surface of the cover plate, a width of the display screen being larger than a width of the cover plate, and the cover plate having a side edge indented inwards relative to the display screen;
   a bracket having a top portion, a bottom portion, and a side wall, the top portion of the bracket being continuous and flat, and opposite to an entirety of the display screen, the bottom portion of the bracket defining an accommodating space therein, and a middle part of the top portion of the bracket being joined with a bottom surface of the display screen; and
   a decoration enclosure having a first joining part and a second joining part bending from the first joining part, the first joining part being joined with the side wall of the bracket, and the second joining part being joined with the side edge of the cover plate and configured to shield a non-display area of the display screen.

2. The display screen assembly according to claim 1, wherein the side edge of the cover plate is configured as a first inclined surface, and a surface of the second joining part joined to the side edge of the cover plate is configured as a second inclined surface configured to be fitted with the first inclined surface.

3. The display screen assembly according to claim 1, wherein the first joining part is joined with the side wall of the bracket in an adhering manner.

4. The display screen assembly according to claim 1, wherein the top surface of the display screen is joined with the lower surface of the cover plate in a full lamination manner.

5. The display screen assembly according to claim 1, wherein the top surface of the display screen is laminated with the lower surface of the cover plate through an optically clear adhesive.

6. The display screen assembly according to claim 1, wherein the bottom surface of the display screen is joined with the top portion of the bracket in an adhering manner.

7. The display screen assembly according to claim 1, wherein the cover plate is configured as a touch-screen cover plate.

8. The display screen assembly according to claim 1, wherein an outer surface of the decoration enclosure is configured as an arc surface.

9. An electronic device, comprising a display screen assembly and a rear cover coupled to the display screen assembly so as to define an accommodating space therebetween, wherein the display screen assembly comprises:
   a cover plate;
   a display screen having a top surface joined with a lower surface of the cover plate, the display screen having a width larger than the cover plate, and a side edge of the cover plate being indented inwards relative to the display screen;
   a bracket having a top portion joined with a bottom surface of the display screen, and a side wall, wherein the top portion of the bracket is continuous and flat, and opposite to an entirety of the display screen, the bottom portion of the bracket defines the accommodating space therein and a middle part of the top portion is joined with the bottom surface of the display screen; and
   a decoration enclosure having a first joining part joined with the side wall of the bracket, and a second joining part bending from the first joining part, joined with the side edge of the cover plate and configured to shield a non-display area of the display screen.

10. The electronic device according to claim 9, further comprising a battery, wherein the battery is received in the accommodating space.

11. The electronic device according to claim 9, wherein the rear cover is coupled to the bracket by at least one of adhering, snapping and screwing.

12. The electronic device according to claim 9, wherein the rear cover is coupled to the decoration enclosure by at least one of adhering, snapping and screwing.

13. The electronic device according to claim 9, wherein the cover plate is configured as a touch-screen cover plate.

14. The electronic device according to claim 13, wherein the cover plate comprises:
   a touch panel having a touch control circuit and configured to achieve a touch operation of the display screen assembly; and
   a protection cover sheet provided on the touch panel and configured to protect the touch panel from being damaged due to direct touch operations on the touch panel.

15. The electronic device according to claim 9, wherein the second joining part protrudes from the first joining part towards the side edge of the cover plate to compensate a width difference between the cover plate and the display screen.

16. The electronic device according to claim 9, wherein the first joining part is joined with the side wall of the bracket in an adhering manner.

17. The electronic device according to claim 9, wherein the top surface of the display screen is joined with the lower surface of the cover plate in a full lamination manner.

18. An assembling method, comprising:
   providing a bracket having a top portion and a side wall;
   providing a decoration enclosure having a first joining part and a second joining part bending from the first joining part;
   joining the first joining part with the side wall of the bracket by dispensing adhesive therebetween;
   providing a display screen and a cover plate;
   mounting the display screen and the cover plate on the top portion of the bracket wherein the top portion of the bracket is continuous and flat, and opposite to an entirety of the display screen, the bottom portion of the bracket defines an accommodating space therein and a middle part of the top portion is joined with a bottom surface of the display screen; and
   contacting a side edge of the cover plate with the second joining part, joining the side edge of the cover plate with the second joining part by dispensing adhesive therebetween and shielding a non-display area of the display screen by the second joining part, wherein the side edge of the cover plate is directly adhered to the second joining part.

19. The assembling method according to claim 18, wherein mounting the display screen and the cover plate on the top portion of the bracket comprises:
   adhering the display screen on the top portion; and
   laminating the cover plate on the display screen fully.

20. The assembling method according to claim 18, wherein mounting the display screen and the cover plate on the top portion comprises:
   laminating the cover plate on the display screen fully; and
   mounting the cover plate and the display screen fully laminated with the cover plate on the top portion of the bracket.

* * * * *